(12) United States Patent
Kubota et al.

(10) Patent No.: US 6,592,812 B1
(45) Date of Patent: Jul. 15, 2003

(54) ALUMINUM ALLOY THIN FILM TARGET MATERIAL AND METHOD FOR FORMING THIN FILM USING THE SAME

(75) Inventors: Takashi Kubota, Ageo (JP); Hiroshi Watanabe, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/787,434
(22) PCT Filed: Aug. 10, 2000
(86) PCT No.: PCT/JP00/05361
§ 371 (c)(1), (2), (4) Date: Mar. 26, 2001
(87) PCT Pub. No.: WO01/14607
PCT Pub. Date: Mar. 1, 2001

(30) Foreign Application Priority Data

Aug. 19, 1999 (JP) ............................................. 11-232201

(51) Int. Cl.$^7$ .......................... C22C 21/06; C23C 14/00
(52) U.S. Cl. ..................... 420/542; 148/440; 204/192.1
(58) Field of Search ................................ 420/542, 543, 420/544, 545, 546, 547; 148/440, 437, 438, 439; 204/192.1

(56) References Cited

U.S. PATENT DOCUMENTS 4,600,556 A * 7/1986 Donachie et al. ........... 420/542

FOREIGN PATENT DOCUMENTS

| JP | 1-201435 | 8/1989 |
| JP | 7-268617 | 10/1995 |
| JP | 11-3873 A | 1/1999 |
| JP | 2000-235961 A | 8/2000 |

* cited by examiner

*Primary Examiner*—George Wyszomierski
*Assistant Examiner*—Janelle Combs Morillo
(74) *Attorney, Agent, or Firm*—Rothwell Figg Ernst & Manbeck, P.C.

(57) ABSTRACT

The present invention provides a heat-resistant and low-electric-resistance aluminum alloy thin film which, even after heat treatment at 300–400° C., exhibits no hillock generation and has a specific resistance of 7 $\mu\Omega$·cm or less and also provides a sputtering target material employed for forming such aluminum alloy thin film. The thin film of aluminum alloy of the present invention contains, as components of the alloy, aluminum, carbon, and magnesium, wherein the carbon content and the magnesium content fall within a region defined by the following formulas:

$$X=0.61;\ X=8;\ Y=2;\ \text{and}\ Y=-0.13X+1.3,$$

wherein Y (at %) represents the carbon content by atomic percent and X (at %) represents the magnesium content by atomic percent, and the balance of (X+Y) contains aluminum and unavoidable impurities. The sputtering target material of the present invention for forming thin film of aluminum alloy, containing, as components of the material, aluminum, carbon, magnesium, and unavoidable impurities, wherein the carbon content and the magnesium content fall within a region defined by the aforementioned formulas, and the balance of (X+Y) is aluminum and unavoidable impurities.

3 Claims, 7 Drawing Sheets

○: Hillocks did not generate after heat treatment at 400°C
△: Hillocks did not generate after heat treatment at 300°C but generated after heat treatment at 400°C
×: Hillocks generated after heat treatment at 300°C (a)

(b)

(a)

(b)

(a)

(b)

(a)

(b)

(a)

(b)

(c)

(d)

ALUMINUM ALLOY THIN FILM TARGET MATERIAL AND METHOD FOR FORMING THIN FILM USING THE SAME

TECHNICAL FIELD

The present invention relates to a thin film of aluminum alloy, a sputtering target material for forming a thin film of aluminum alloy, and a method for forming a thin film of aluminum alloy. More particularly, the invention relates to a thin film of aluminum alloy which is endowed with high heat resistance and low electric resistance and which is used for forming thin film wiring for liquid crystal displays, electrodes, wiring of semiconductor integrated circuits, and similar purposes; a sputtering target material for forming of such aluminum alloy thin film; and a method of forming such aluminum alloy thin film.

BACKGROUND ART

In recent years, liquid crystal displays used in display units of computers and in notebook-type personal computers have come to be larger in size and possess a higher resolution. Recently, in the field of liquid crystal displays, there has been an increasing demand for thin film transistor (TFT) liquid crystal displays, and to keep pace with this trend, they are required to have better characteristics. Particularly, the greater the dimension and the higher the resolution of liquid crystal display devices, the lower the specific resistance (10 $\mu\Omega$·cm or lower) the wiring material is required to have. This demand stems from the necessity of preventing signal delays arising from the formation of long, fine wiring.

Hitherto, high-melting-point materials such as Ta, Cr, Ti, and alloys thereof have been employed as wiring materials for fabricating liquid crystal displays. However, since these high-melting-point materials have an excessively high specific resistance, limitations have been imposed on use thereof in the wiring of the aforementioned wide-dimension and high-resolution liquid crystal displays.

Under such circumstances, elemental aluminum has become of interest as a wiring material due to its very low specific resistance—as low as approximately 3 $\mu\Omega$·cm—and high ease of handling in wiring. However, elemental aluminum—having a relatively low melting point of 600° C.—exhibits disadvantageously low heat resistance.

After aluminum thin film is formed on a substrate through sputtering and the thus-formed thin film is processed to thereby form wiring, insulating film is formed on the wiring through CVD. During the CVD process, the aluminum wiring is heated to 300–400° C. During heating, nodular bumps called "hillocks" are generated on the surface of the aluminum thin film. These hillocks penetrate the insulating layer, thereby causing a short circuit with the adjacent upper layer, or between layers adjacent to one another, leading to failures.

In order to solve the above problem, a number of companies have developed aluminum alloys to which another alloying element has been added, and the resultant alloys have come to be used widely. Such alloying is known to prevent the generation of hillocks to a considerable degree. Regarding thin film of an aluminum alloy such as Al—Ti, which has heretofore been employed, hillock generation is certainly prevented by controlling the amount of an added alloying element such as Ti.

However, addition of another alloying element to an aluminum alloy also elevates the specific resistance to higher than 10 $\mu\Omega$·cm. Species and amounts of additional elements greatly affect the characteristics of aluminum alloy thin film. Thus, it is desired to produce an aluminum alloy thin film which has a low electric resistance and a high heat resistance and in which hillock generation is prevented.

Thus, an object of the present invention is to provide aluminum alloy thin film which is endowed with heat resistance and low electric resistance, even after being subjected to heat treatment at 300–400° C., which prevents generation of hillocks, and which has a specific resistance of 7 $\mu\Omega$·cm or less. Another object of the present invention is to provide a sputtering target material employed for forming the aforementioned aluminum alloy thin film. Still another object of the present invention is to provide a method for forming the aforementioned aluminum alloy thin film.

DISCLOSURE OF THE INVENTION

The present inventors have conducted extensive studies so as to solve the aforementioned problems, and have found the following:

when the alloy composition of aluminum alloy thin film is of the Al—C—Mg-base and the carbon content and the magnesium content is controlled to fall within predetermined ranges, the aforementioned problems can be solved;

when a sputtering target material is formed of an Al—C—Mg alloy having a predetermined composition, the aforementioned problems can be solved; and when the substrate temperature is controlled to, preferably, a predetermined temperature during formation of aluminum alloy thin film through sputtering, the aforementioned problems can be solved. The present invention has been accomplished on the basis of these findings.

Accordingly, the present invention provides a thin film of aluminum alloy, comprising, as components of the alloy, aluminum, carbon, and magnesium, characterized in that the carbon content and the magnesium content fall within a region defined by the following formulas:

X=0.61;

X=8;

Y=2;

and

Y=−0.13X+1.3, wherein Y (at %) represents the carbon content by atomic percent and X (at %) represents the magnesium content by atomic percent, and the balance of (X+Y) comprises aluminum and unavoidable impurities.

The present invention also provides a sputtering target material for forming thin film of aluminum alloy, comprising, as components of the material, aluminum, carbon, magnesium, and unavoidable impurities, characterized in that the carbon content and the magnesium content fall within a region defined by the following formulas:

X=0.61;

X=8;

Y=2;

and

Y=−0.13X+1.3, wherein Y (at %) represents the carbon content by atomic percent and X (at %) represents the magnesium content by atomic percent, and the balance of (X+Y) comprises aluminum and unavoidable impurities.

The present invention further provides a method for forming a thin film of aluminum alloy, comprising sputtering the aforementioned sputtering target material, to thereby form the aforementioned thin film of aluminum alloy, wherein the substrate temperature is maintained at 180–400° C. during sputtering.

BEST MODE FOR CARRYING OUT THE INVENTION

Figure 1:
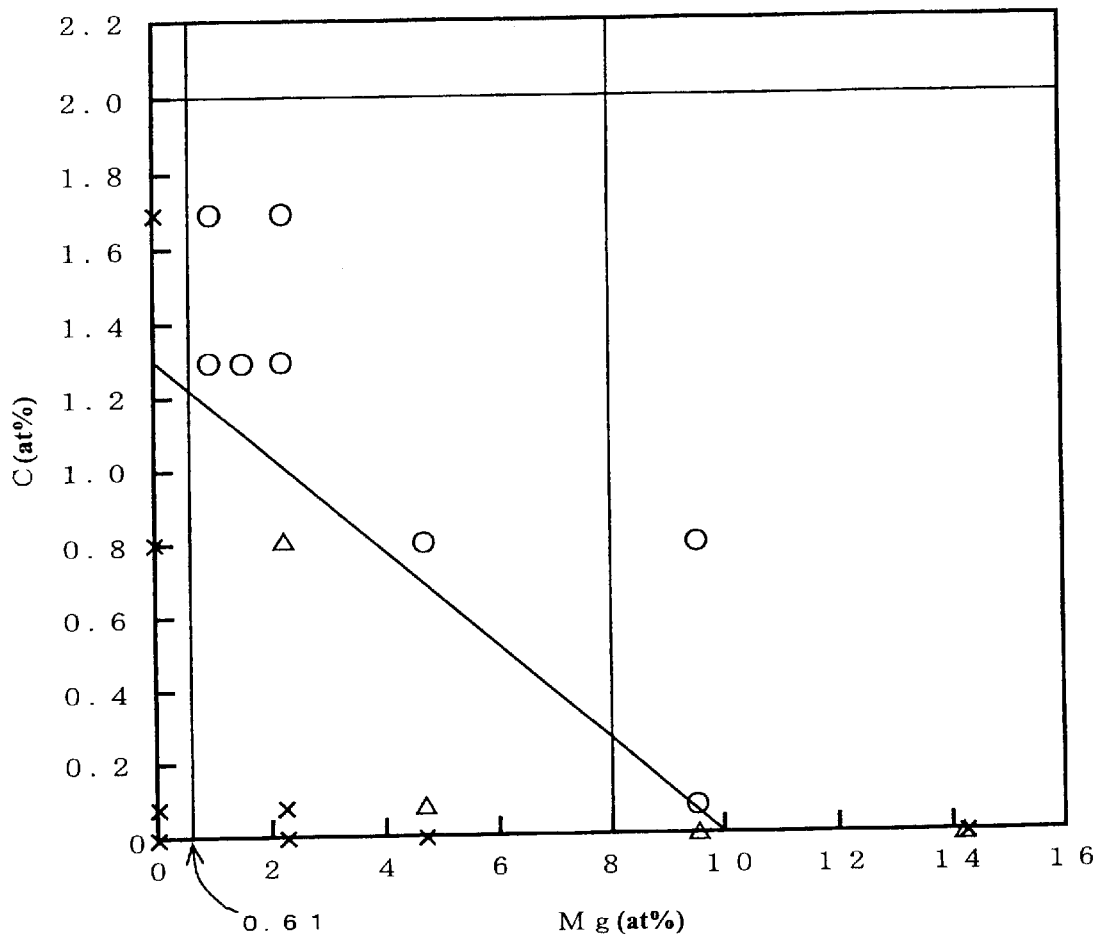
FIG. 1 is a graph showing the relationship between the composition of each thin film and the incidence of hillock generation.

The heat resistance of aluminum alloy thin film can be evaluated on the basis of hillock generation during heat treatment after completion of film formation. When the aluminum alloy thin film formed on a glass substrate is subjected to a thermal process of at 300–400° C., the film itself expands. Since aluminum alloy generally has a coefficient of thermal expansion approximately ten times that of glass, the aluminum alloy thin film undergoes a compressive stress. When the aluminum alloy thin film contains large and small grains, the small crystal grains serve as nuclei which cause migration of aluminum, resulting in precipitation and grain growth, thereby achieving a stress relaxation. Hillocks are generated near the sites of stress relaxation. This mechanism is generally thought to be the mechanism that causes hillock generation. In other words, the driving force for generating hillocks is the compressive stress applied to the aluminum alloy thin film during a thermal process, and crystal nuclei—if they are contained in the alloy film—cause migration, thereby generating hillocks.

By adding a small amount of carbon to an aluminum alloy, the crystal grain size of the aluminum alloy generally decreases, and the metallographic texture of the alloy thin film exhibits a uniform size of crystal grains. As a result, stress is dispersed evenly over the aluminum alloy thin film. The metallographic texture of an elemental aluminum thin film and that of an Al—C alloy thin film, which have been formed under the same conditions, were observed under a transmission electron microscope (TEM). The crystal grain size of the elemental aluminum thin film was found to be approximately 0.05–0.3 $\mu$m with a considerable level of variance, whereas that of the Al—C alloy thin film was found to be 0.1 $\mu$m or less with a small variance.

However, a certain degree of hillock is generated in the Al—C alloy after a thermal process, and surface smoothness of the Al—C alloy film is prone to decrease after the thermal process, accompanied by a decrease in reflectivity. In Al—C alloy, carbon exerts a lesser effect in terms of elevating the specific resistance of thin film of the alloy as compared with other elements, since carbon hardly forms a solid solution with aluminum. However, addition of carbon in a small amount does not completely prevent hillock generation. When carbon is added in such a large amount that hillock generation is completely prevented, the electric resistance of the alloy thin film is inclined to increase. Thus, employment of Al—C alloy may be difficult.

Further addition of magnesium to Al—C alloy prevents hillock generation after a thermal process as well as maintaining the surface smoothness of the alloy thin film to a favorable extent and the specific resistance thereof to a low level.

The thus-prepared Al—C—Mg alloy exhibits a specific resistance of 7 $\mu\Omega$·cm or lower, has heat resistance, and thus prevents hillock generation. In addition, since such alloys employed in the manufacture of automobile parts, for example, Al—Mg alloy, are corrosion-resistant, wiring made from the alloy thin film of the present invention is expected to exhibit enhanced corrosion resistance.

When the carbon content in the Al—C—Mg alloy is in excess of 2 at % or the magnesium content is in excess of 8 at %, the alloy thin film is disadvantageously prone to having a specific resistance higher than 7 $\mu\Omega$·cm. When the carbon content and the magnesium content have the following relationship:

$Y<-0.13X+1.3$;

hillocks tend to be generated after heat treatment at 400° C., which is also disadvantageous.

Carbon added to Al alloy, together with Mg contained in the Al alloy, precipitates in the form of $MgC_2$. In consideration of this phenomenon, when the Mg content is less than 0.61 at %, effect of added Mg would be insufficient and preparing the alloy may be difficult.

Accordingly, the thin film of aluminum alloy of the present invention comprises, as components of the alloy, aluminum, carbon, and magnesium, wherein the carbon content and the magnesium content fall within a region defined by the following formulas:

$X=0.61$;

$X=8$;

$Y=2$;

and $Y=-0.13X+1.3$, and the balance of (X+Y) comprises aluminum and unavoidable impurities. Specifically, as shown in the graph of FIG. 1 where the Y axis represents the carbon content and the X axis represents the magnesium content, the carbon content and the magnesium content fall within a region defined by straight lines of $Y=-0.13X+1.3$; $X=0.61$; $X=8$; and $Y=2$. Values on the straight lines are also included in the region.

The sputtering target material of the present invention for forming a thin film of aluminum alloy is capable of forming the aforementioned aluminum alloy thin film. The target material comprises, as components of the material, aluminum, carbon, magnesium, and unavoidable impurities, wherein the carbon content and the magnesium content fall within a region defined by the following formulas:

$X=0.61$;

X=8;

Y=2;

and

Y=−0.13X+1.3, and the balance of (X+Y) comprises aluminum and unavoidable impurities.

No particular limitation is imposed on the shape and form of the aforementioned target material, and any shape and form can be employed in accordance with the sputtering method, the type of sputtering apparatus, etc. For example, the form of the target material may be an alloy, a homogeneous mixture, or a chip-buried body.

In the method of forming aluminum alloy thin film according to the present invention, the aforementioned sputtering target is sputtered while the substrate temperature is maintained at 180–400° C. during sputtering. When the substrate temperature is lower than 180° C., hillocks tend to generate disadvantageously and readily during a subsequent thermal process. The substrate temperature can be elevated to an arbitrary level so long as the substrate and the formed thin film are not adversely affected. However, the temperature is preferably approximately 180–350° C., more preferably 180–300° C., in view of such conditions as energy efficiency, operation circumstances, and apparatus.

By carrying out sputtering at the aforementioned substrate temperature, the compressive stress applied to the thin film during a thermal process after film formation is minimized to as low a level as possible, thereby preventing hillock generation. In addition, specific resistance of the film after the thermal process at 300–400° C. can be reduced. The aluminum alloy thin film exhibits a specific resistance of 7 $\mu\Omega$·cm or lower in an as-deposited state (immediately after sputtering). Thus, the thin film can be employed as a low-electric-resistance wiring material even when the thin film is applied after a thermal process. Although hillock generation in elemental aluminum thin film can also be suppressed by elevating the substrate temperature, complete suppression cannot be attained.

The aluminum alloy thin film of the present invention exhibits remarkably high surface smoothness in an as-deposited state or after a thermal process. The reason for such smoothness seems to be attributable to the suppression of crystal grain growth through the action of the additive elements. Thus, since the aluminum alloy thin film of the present invention exhibits remarkably high surface smoothness in an as-deposited state or after having undergone a thermal process, the light reflectivity of the film is considerably high. This unique property of the thin film has never been previously attained for conventional aluminum alloy thin film. In recent years, reflection-type liquid crystal display panels that do not employ a backlight have been produced. Such display panels require electrode thin film exhibiting a high degree of light reflectivity. Accordingly, the aluminum alloy thin film of the present invention can satisfactorily be employed for light-reflecting electrodes.

EXAMPLES

The present invention will next be described in detail by way of Examples and Comparative Examples. For Examples 1 to 6 and Comparative Examples 1 to 15, conditions and test results in terms of film composition, substrate temperature, specific resistance, and incidence of hillock generation are collectively shown in Table 1.

Each of the elemental aluminum thin film samples and alloy thin film samples of a variety of compositions shown in Table 1 was formed through DC magnetron sputtering by use of a sputtering target material having a composition identical to the composition of the corresponding film. The following sputtering conditions were employed: substrate (1.1-mm-thick glass plate #1737, product of Corning Glass Works, maintained at a temperature shown in Table 1); input electric power (3 W/cm$^2$); and sputtering pressure (333.25× 10$^{-3}$ Pa (2.5 mTorr)). The composition of each of the thus-obtained film samples and the specific resistance of each film in an as-deposited state (immediately after sputtering) are shown in Table 1 (film samples formed in Examples and Comparative Examples had a thickness of approximately 3000 Å).

These glass plates onto which aluminum or aluminum alloy thin film had been formed were subjected to heat treatment at 300° C. and 400° C., respectively, for one hour in a vacuum. The specific resistance of each film is shown in Table 1, and the incidence of hillock generation is shown in Table 1 and FIG. 1.

Hillock generation was observed under a scanning electron microscope (SEM) at magnifications of 500 and 5,000. Samples which exhibited no hillock generation at both magnifications are denominated as "hillock free." The specific resistance of the thin film was measured by means of a four-terminal resistance meter.

The carbon content analysis was carried out by means of a gas analyzer. Samples for measuring the carbon content were prepared by forming alloy thin film to a thickness of approximately 10 $\mu$m on a substrate under conditions similar to those employed in the aforementioned method, and then peeling the formed thin film from the substrate. The magnesium content in aluminum alloy thin film was measured through inductively coupled plasma (ICP) atomic emission spectroscopy.

TABLE 1

| | Film composition | Substrate temp. (° C.) | Specific resistance of film ($\mu\Omega_{cm}$) | | | Hillock generation | |
|---|---|---|---|---|---|---|---|
| | | | as-deposited | 300° C. | 400° C. | 300° C. | 400° C. |
| Comp. Ex. 1 | Al(5N) | 200 | 3.21 | 3.19 | 3.19 | yes | yes |
| Comp. Ex. 2 | Al-0.07 C | 200 | 3.55 | 3.04 | 3.07 | yes | yes |
| Comp. Ex. 3 | Al-0.8 C | 200 | 4.63 | 4.49 | 4.40 | yes | yes |
| Comp. Ex. 4 | Al-1.7 C | 200 | 4.83 | 5.03 | 4.73 | yes | yes |
| Comp. Ex. 5 | Al-2.25 Mg | 200 | 4.22 | 4.10 | 3.83 | yes | yes |
| Comp. Ex. 6 | Al-4.77 Mg | 200 | 4.85 | 4.54 | 6.80 | yes | yes |
| Comp. Ex. 7 | Al-9.64 Mg | 200 | 10.0 | 8.82 | 7.06 | no | yes |

TABLE 1-continued

| | Film composition | Substrate temp. (° C.) | Specific resistance of film ($\mu\Omega_{cm}$) as-deposited | 300° C. | 400° C. | Hillock generation 300° C. | 400° C. |
|---|---|---|---|---|---|---|---|
| Comp. Ex. 8 | Al-14.3 Mg | 200 | 15.0 | 14.0 | 4.95 | no | yes |
| Comp. Ex. 9 | Al-0.07 C-2.3 Mg | 200 | 4.20 | 3.77 | 3.86 | yes | yes |
| Comp. Ex. 10 | Al-0.07 C-4.8 Mg | 200 | 5.12 | 5.50 | 6.40 | no | yes |
| Comp. Ex. 11 | Al-0.07 C-9.5 Mg | 200 | 9.50 | 8.53 | 5.91 | no | no |
| Comp. Ex. 12 | Al-0.8 C-2.3 Mg | 200 | 4.80 | 4.40 | 4.04 | no | yes |
| Example 1 | Al-0.8 C-4.8 Mg | 200 | 6.44 | 6.43 | 5.29 | no | no |
| Comp. Ex. 13 | Al-0.8 C-9.5 Mg | 200 | 10.0 | 8.92 | 5.75 | no | no |
| Example 2 | Al-1.3 C-1.5 Mg | 200 | 5.14 | 5.08 | 4.83 | no | no |
| Example 3 | Al-1.3 C-2.3 Mg | 200 | 5.45 | 5.01 | 4.50 | no | no |
| Example 4 | Al-1.7 C-2.3 Mg | 200 | 6.59 | 6.03 | 5.37 | no | no |
| Example 5 | Al-1.3 C-1.0 Mg | 200 | 5.18 | 4.90 | 4.44 | no | no |
| Example 6 | Al-1.7 C-1.0 Mg | 200 | 5.71 | 5.34 | 4.99 | no | no |
| Comp. Ex. 14 | Al-1.3 C-1.5 Mg | 100 | 6.26 | 5.70 | 4.93 | yes | yes |
| Comp. Ex. 15 | Al-1.3 C-2.3 Mg | 100 | 7.36 | 6.83 | 5.33 | no | yes |

Figure 2:
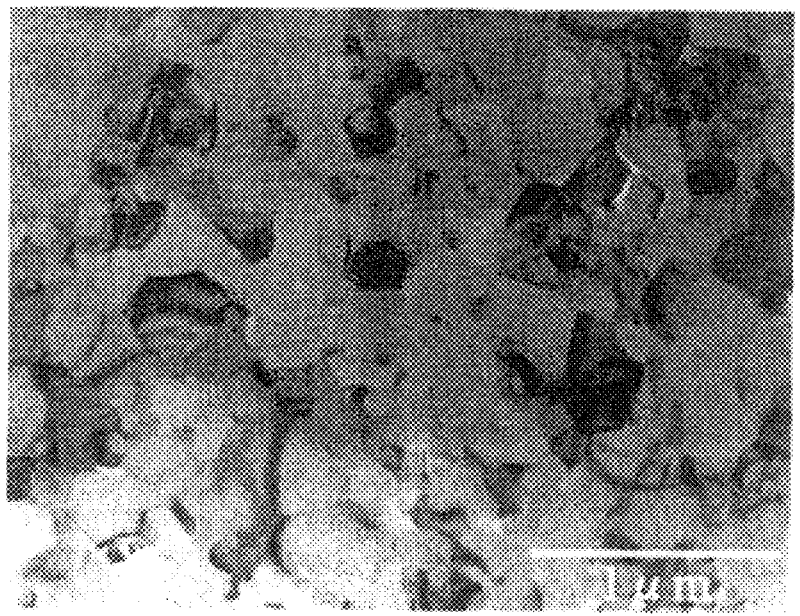
FIG. 2 shows photographic images of metallographic textures of thin film samples observed through TEM.
Figure 2:
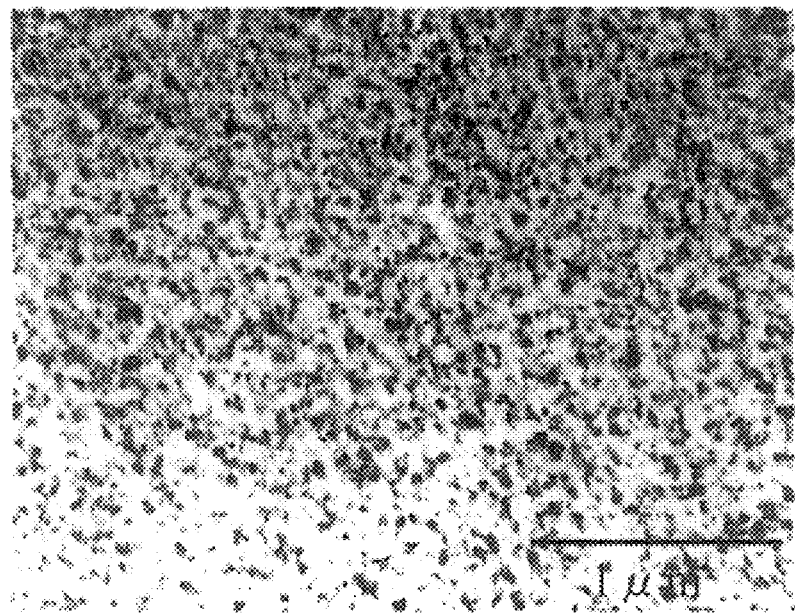

The results of observing the metallographic texture of the thin film samples under a TEM will next be described. FIG. 2 shows photographs of the metallographic texture of thin film samples. Each of the film samples was formed on a substrate (100° C.) so that the film had a composition as in Comparative Example 1 or Comparative Example 4 as shown in Table 1, a thickness of 0.15 µm, and was subjected to heat treatment at 300° C. for one hour in a vacuum. FIG. 2(a) shows the texture of the elemental aluminum thin film of Comparative Example 1, and FIG. 2(b) shows the thin film of Al-1.7 at % C of Comparative Example 4. As is clear from the photographs, the size of crystal grains contained in the elemental aluminum thin film is larger than that of crystal grains contained in the Al-1.7 at % C thin film. More specifically, the crystal grains contained in the elemental aluminum thin film had a grain size of approximately 0.05–0.3 µm with a considerable level of variance, whereas those contained in the Al-1.7 at % C thin film were very minute and had a grain size of less than 0.1 µm with a small variance. The results indicate that a decrease in size of crystal grains contained in thin film can be attained by forming thin film employing an aluminum target to which carbon is added. Although no TEM photograph is shown, the thin film samples of Examples 1 to 6 were also confirmed to have a fine metallographic texture, similar to the thin film of Comparative Example 4.

The results shown in Table 1 will be described. The aluminum alloy thin film samples (Examples 1 to 6) produced from the target materials according to the present invention; i.e., Al-0.8 at % C-4.8 at % Mg, Al-1.3 at % C-1.5 at % Mg, Al-1.3 at % C-2.3 at % Mg, Al-1.7 at % C-2.3 at % Mg, Al-1.3 at % C-1.0 at % Mg, and Al-1.7 at % C-1.0 at % Mg, generated no hillocks after heat treatment at 400° C., let alone at 300° C. As is clear from Table 1, the specific resistance of the film samples was 7 µΩ·cm or less.

Hillocks were generated in both heat treatment cases of 300° C. and 400° C. in the following samples; i.e., the elemental aluminum thin film formed from the target material of Comparative Example 1; the Al—C alloy thin film samples formed from the target materials of Comparative Examples 2 to 4; the low-Mg content Al—Mg alloy thin film samples formed from the target materials of Comparative Examples 5 and 6; and the Al—C—Mg alloy thin film formed from the target material of Comparative Example 9 and having a carbon content much lower than the values of −0.13X+1.3.

Figure 3:
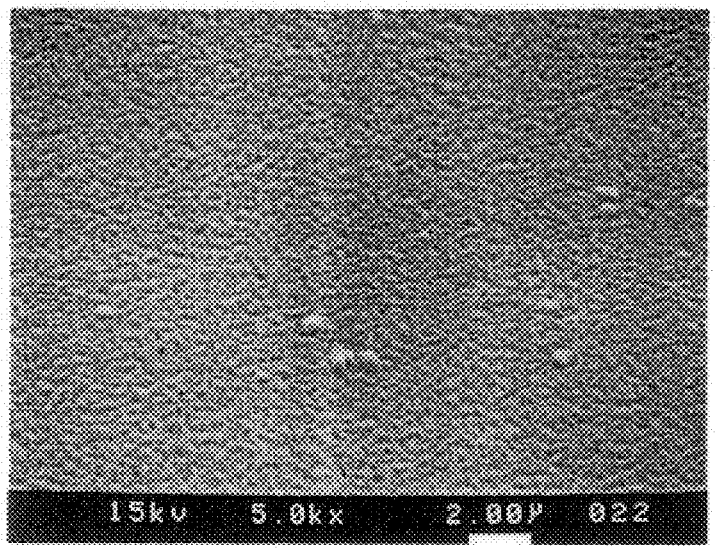
FIG. 3 shows SEM photographic images of a surface of the thin film of Comparative Example 1 to investigate the incidence of hillock generation.
Figure 3:
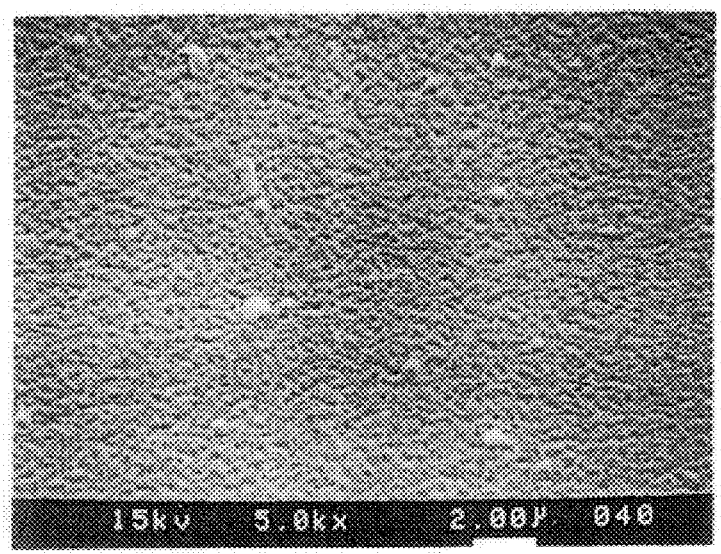
Figure 4:
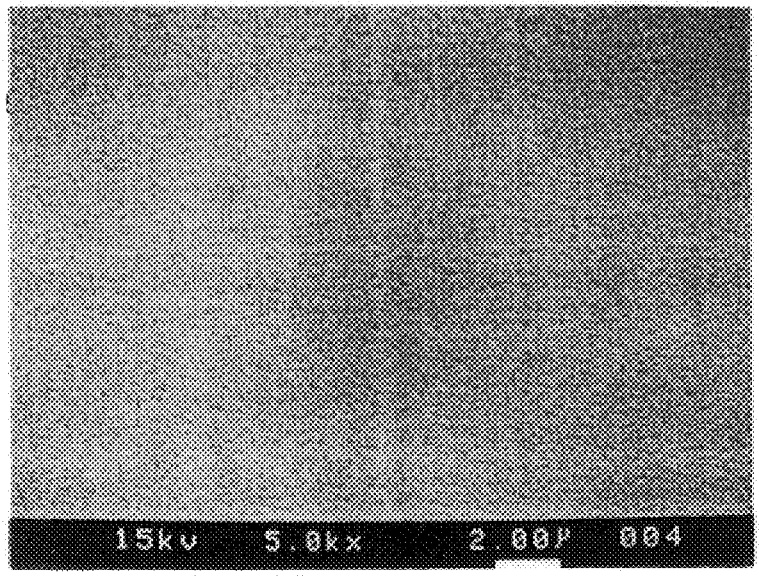
FIG. 4 shows SEM photographic images of a surface of the thin film of Example 3 to investigate the incidence of hillock generation.
Figure 4:
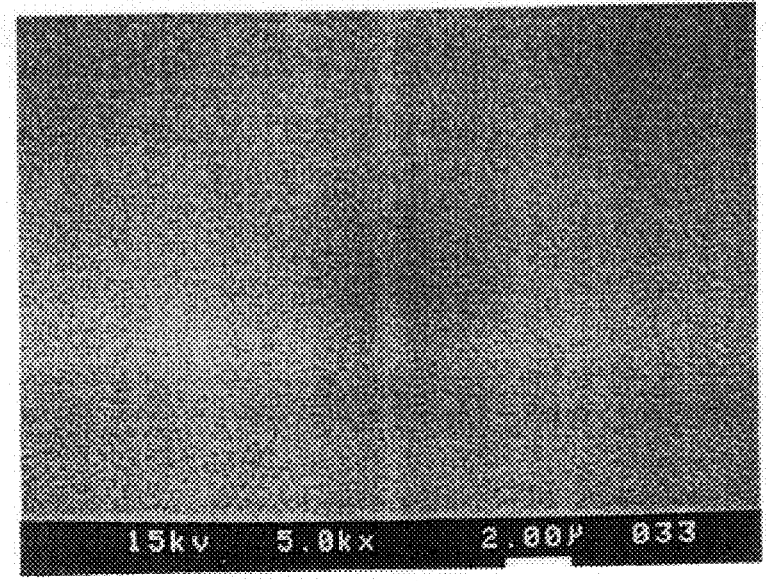

SEM photographs which confirmed hillock generation will next be described. FIG. 3 shows photographs (×5000) of the elemental aluminum thin film of Comparative Example 1 (after heat treatment at 300° C. (FIG. 3(a)), and after heat treatment at 400° C. (FIG. 3(b))). FIG. 4 shows photographs (×5000) of the Al-1.3 at % C-2.3 at % Mg alloy thin film of Example 3 (after heat treatment at 300° C. (FIG. 4(a)), and after heat treatment at 400° C. (FIG. 4(b))). As shown in FIGS. 3(a) and 3(b), it was confirmed that the elemental aluminum thin film generated nodular bumps; i.e., hillocks, during heat treatment at both 300° C. and 400° C. In contrast, no hillock generation was confirmed in the Al-1.3 at % C-2.3 at % Mg alloy thin film of Example 3 regardless of the temperature of heat treatment. As shown in FIG. 4, the thin film of Example 3 has been found to have a highly smooth surface. Although the SEM images of thin film samples of the other Examples are not shown, these samples have also been confirmed to have surface conditions similar to those of the thin film of Example 3.

After heat treatment at 300° C., no hillock generation was observed in any of the high-Mg Al—Mg alloy thin film samples formed from the target materials of Comparative Examples 7 and 8 or the Al—C—Mg alloy thin film samples formed from the target material of Comparative Examples 10 and 12 and having a carbon content lower than the values of −0.13X+1.3. However, after heat treatment at 400° C., hillock generation was observed in these samples. No hillock generation was observed, even after heat treatment at 400° C., in the Al—Mg alloy thin film samples formed from the target materials of Comparative Examples 11 and 13 and having a magnesium content in excess of 8 at %. However, these film samples had a high specific resistance.

The substrate temperature was controlled to 100° C. in Comparative Examples 14 and 15. In these cases, hillock generation was more predominant and the specific resistance increased as compared to the film samples of Examples 2 and 3. The results indicate that elevation of the substrate temperature prevents hillock generation and improves specific resistance of such thin film.

Figure 5:
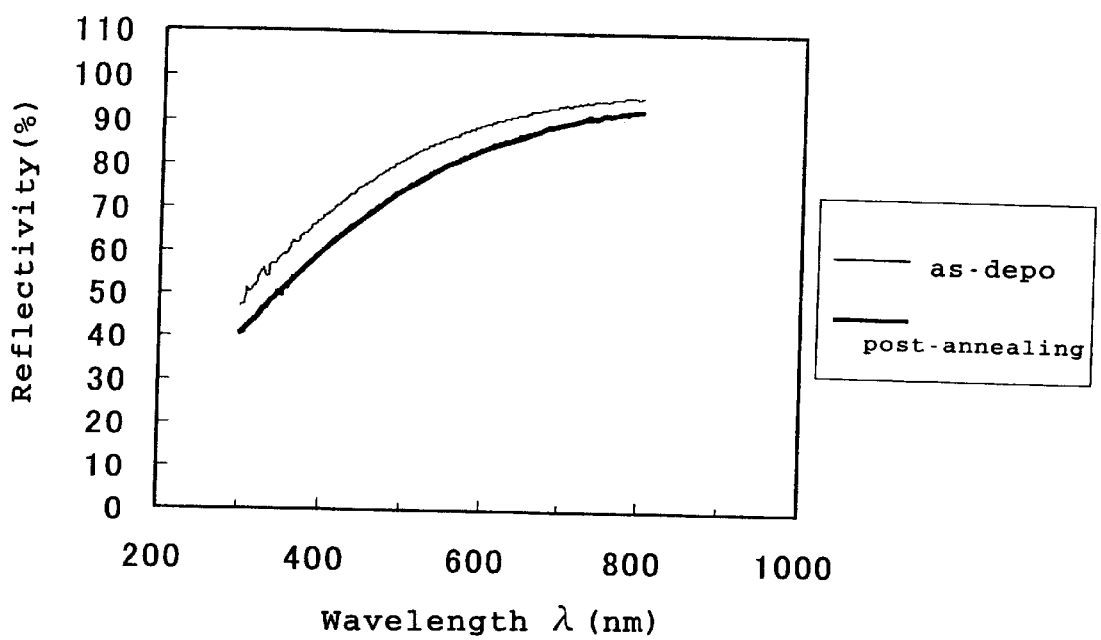
FIG. 5 includes two graphs showing the results of reflectance measurement.
Figure 5:
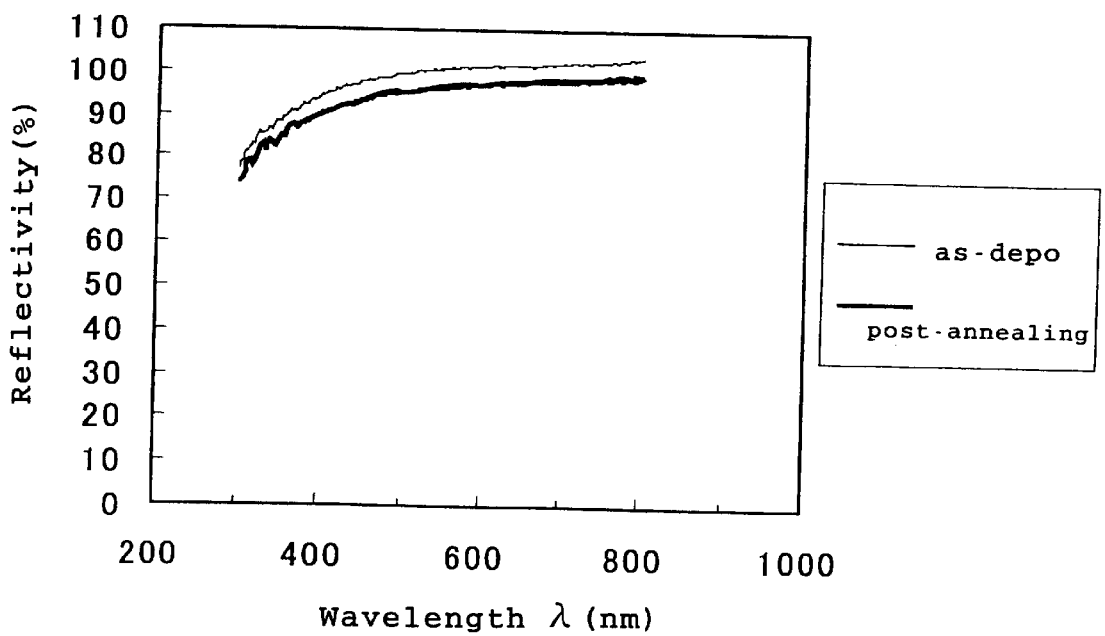

Next, the results of the reflectivity measurement of the thin film sample of Example 3 will be described. The reflectivity was evaluated by comparing the reflectivity with that obtained through measurement of the elemental aluminum thin film sample of Comparative Example 1. In both cases, reflectivity was measured for an as-deposited state and after heat treatment at 400° C. The reflectivity was measured by means of a spectrophotometer (U-4000, product of Hitachi Ltd.). An integrating sphere was employed as a light-acceptor, and the relative reflectivity was measured over 300–800 nm, with elemental aluminum thin film serving as a reference. Thus, a measurement exceeding 100% was attained when the reflectivity of the sample was higher than that of the reference. FIG. 5 provides graphs showing results of reflectivity measurement over the wavelength of 300–800 nm. FIG. 5(*a*) shows reflectivity profiles of the thin film sample of Comparative Example 1, and FIG. 5(*b*) shows reflectivity profiles of the thin film sample of Example 3.

As shown in FIG. 5, a high reflectivity of the thin film sample of Example 3 was confirmed both in an as-deposited state and after heat treatment at 400° C. Specifically, in an as-deposited state, the sample of Example 3 exhibited a reflectivity of 100.8% and that of Comparative Example 1 exhibited a reflectivity of 86.0% with respect to visible light of 550 nm. After heat treatment at 400° C., the sample of Example 3 exhibited a reflectivity of 96.4% and that of Comparative Example 1 exhibited a reflectivity of 79.8% with respect to visible light of 550 nm. Accordingly, it was found that the reflectivity of the thin film sample of Example 3 was higher by approximately 15% than that of the sample of Comparative Example 1. When such thin film is employed as a light-reflecting electrode, the "color" of the reflected light is also an important factor. In general, a blue-white color is more preferred than a yellowish color. As shown in the reflectivity profile of the sample of Comparative Example 1, reflectivity decreases as the wavelength of the incident light decreases. Similarly, as shown in the reflectivity profile of the sample of Example 3, reflectivity decreases as the wavelength of the incident light decreases. However, this decrease in reflectivity is smaller than that of the sample of Comparative Example 1. Thus, the thin film of Example 3 has proven to be more suitably employed as a light-reflecting electrode than the thin film of Comparative Example 1.

Figure 6:
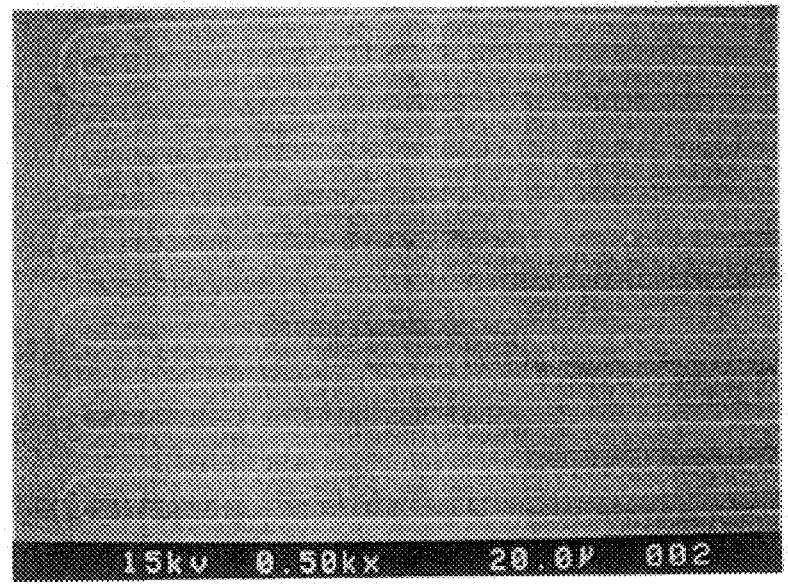
FIGS. 6 and 7 show SEM photographs of microcircuits formed in order to evaluate dry etching characteristics.
Figure 6:
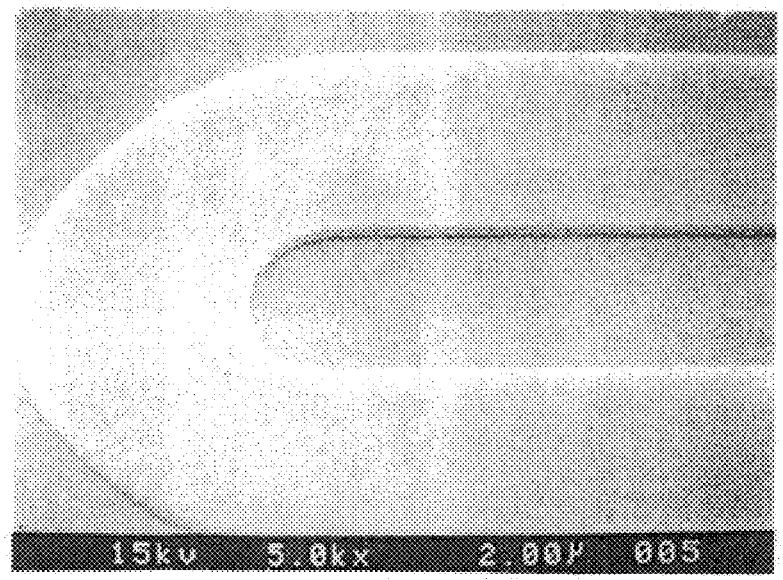
Figure 7:
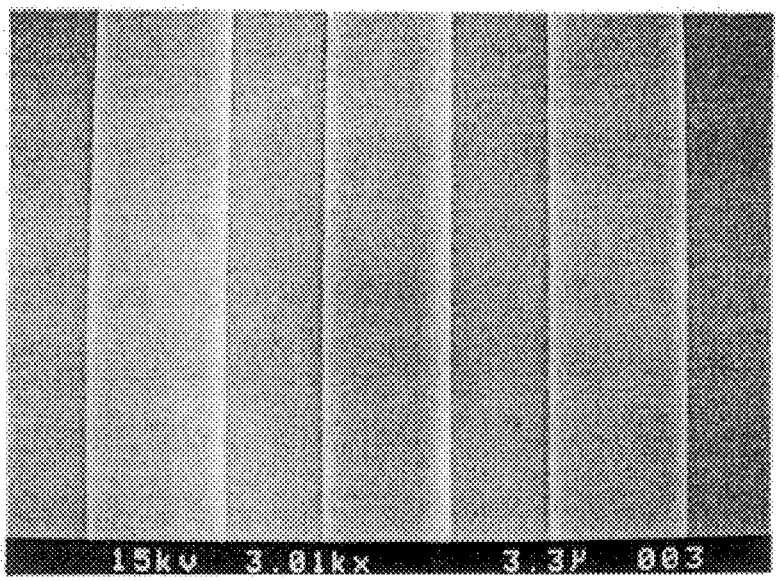
Figure 7:
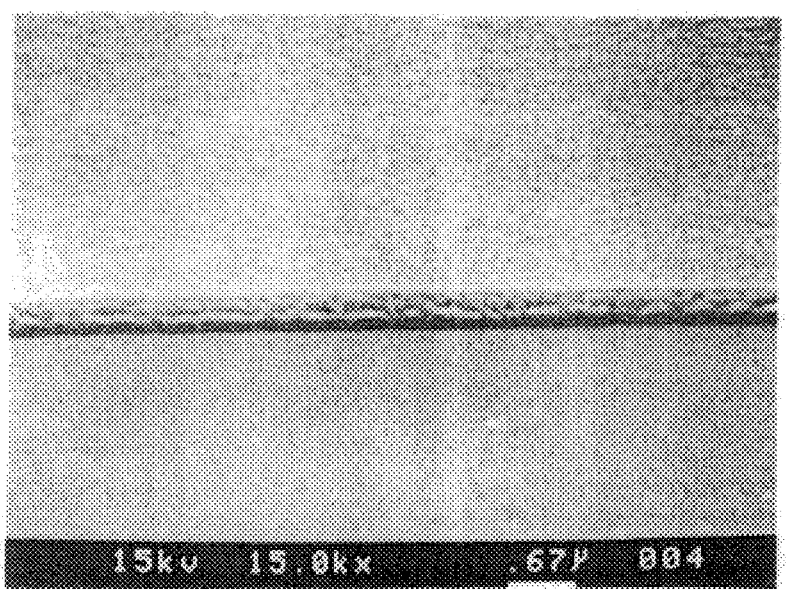

Finally, an evaluation of the dry-etchability of the thin film sample of Example 3 will be described. The dry-etchability was evaluated for the thin film sample of Example 3 which had been formed on a glass substrate and had a thickness of 0.3 μm. The dry etching method that was employed was typical reactive ion etching employing a chlorine-containing gas at 2.67 Pa (0.02 Torr) and high-frequency electric power of 80 W. FIGS. 6 and 7 provide SEM photographs showing fine-circuit lines (line width of 7 μm, line interval of 5 μm) formed through dry etching. As is clear from FIGS. 6(*a*), 6(*b*), 7(*c*), and 7(*d*), the thin film of Example 3 provides sharp circuit patterns both at line portions and curve portions.

EFFECTS OF THE INVENTION

The aluminum alloy thin film of the present invention is a heat-resistant and low-electric-resistance aluminum alloy thin film which, even after heat treatment at 300–400° C., exhibits no hillock generation and has a specific resistance of 7 μΩ·cm or less. By use of the sputtering target material of the present invention, the aforementioned aluminum alloy thin film can be formed. Furthermore, by employing the method of the present invention for forming the aforementioned aluminum alloy thin film, the aforementioned excellent heat-resistant and low-electric-resistance aluminum alloy thin film can be produced.

What is claimed is:

1. A thin film of aluminum alloy, comprising, as components of the alloy, aluminum, carbon, and magnesium, characterized in that the carbon content and the magnesium content fall within a region defined by the following formulas:

$X=0.61$;

$X=8$;

$Y=2$;

and $Y=-0.13X+1.3$, wherein Y (at %) represents the carbon content by atomic percent and X (at %) represents the magnesium content by atomic percent, and the balance of (X+Y) comprises aluminum and unavoidable impurities.

2. A sputtering target material for forming thin film of aluminum alloy, consisting essentially, as components of the material, of aluminum, carbon, magnesium, and unavoidable impurities, characterized in that the carbon content and the magnesium content fall within a region defined by the following formulas:

$X=0.61$;

$X=8$;

$Y=2$;

and $Y=-0.13X+1.3$, wherein Y (at %) represents the carbon content by atomic percent and X (at %) represents the magnesium content by atomic percent, and the balance of (X+Y) comprises aluminum and unavoidable impurities.

3. A method for forming a thin film of aluminum alloy, comprising sputtering a target material on a substrate, wherein said target material comprises, as components of the target material, aluminum, carbon, magnesium, and unavoidable impurities, wherein the carbon content and the magnesium content fall with a region defined by the following formulas:

$X=0.61$;

$X=8$;

$Y=2$;

and $Y=-0.13X+1.3$;

wherein Y represents the carbon content by atomic percent and X represents the magnesium content by atomic percent, while maintaining the substrate temperature at 180–400° C. during the sputtering of the target material to thereby form a thin film of aluminum alloy.

* * * * *